US005353737A

United States Patent [19]

Koyama et al.

[11] Patent Number: 5,353,737

[45] Date of Patent: Oct. 11, 1994

[54] METHOD FOR FORMING BORON-DOPED SEMICONDUCTING DIAMOND FILMS

[75] Inventors: Hisashi Koyama; Koichi Miyata; Koji Kobashi, all of Kobe, Japan

[73] Assignee: Kabushiki Kaisha Kobe Seiko Sho, Kobe, Japan

[21] Appl. No.: 46,804

[22] Filed: Apr. 16, 1993

[30] Foreign Application Priority Data

Apr. 16, 1992 [JP] Japan .................................... 4-96500

[51] Int. Cl.5 ............................................ C30B 29/04

[52] U.S. Cl. ......................................... 117/90; 117/84

[58] Field of Search ............... 156/613, 614, DIG. 68; 423/446; 437/81, 83, 84

[56] References Cited

U.S. PATENT DOCUMENTS 4,486,286 12/1984 Lewin et al. .

5,086,014 2/1992 Miyata et al. ....................... 437/103

FOREIGN PATENT DOCUMENTS 0457076 11/1991 European Pat. Off. .

2236902 4/1991 United Kingdom .

OTHER PUBLICATIONS

Japanese Journal of Applied Physics, vol. 26, No. 9, Sep. 1987, pp. 1429–1432, T. Kawato et al., "Effects of Oxygen on CVD Diamond Synthesis".

WPI Abstract Accession No. 92-110419/14, JP 4053173, Feb. 20, 1992.

*Primary Examiner*—R. Bruce Breneman

*Assistant Examiner*—Felisa Garrett

*Attorney, Agent, or Firm*—Oblon, Spivak, McClelland, Maier & Neustadt

[57] ABSTRACT

Disclosed is a method for forming a diamond film on a substrate by vapor-phase synthesis using a reaction gas which contains $B_2H_6$ and $O_2$ with a gas concentration ratio (volume %) of $([B_2H_6]/[O_2]) \geqq 1 \times 10^{-4}$ in addition to a hydrocarbon gas in hydrogen. By this invention, it is possible to form p-type semiconducting diamond films having an excellent crystallinity and desired electric characteristics.

2 Claims, 5 Drawing Sheets

METHOD FOR FORMING BORON-DOPED SEMICONDUCTING DIAMOND FILMS

BACKGROUND OF THE INVENTION

1. Field of the Invention

The present invention relates to a method for forming high quality boron-doped diamond films used for semiconducting electronic devices.

2. Description of the Related Art

Diamond has a large band gap 5.5 eV, and a high dielectric breakdown voltage. It also has a high thermal conductivity as compared with traditional semiconducting materials such as silicon. Therefore, diamond is expected to be used for a semiconducting material of electronic devices which can be operated in harsh environments such as high temperature.

P-type semiconducting diamond films can be synthesized by doping boron (B) in diamond films by ion implantation, or by chemical vapor deposition process (hereinafter, referred to as CVD process) using a reaction gas containing $B_2H_6$.

Attempts have been made to fabricate electronic devices such as field effect transistors (FETs) and diodes employing p-type semiconducting diamond films.

However, in the prior art, electronic devices employing diamond films have poor electronic characteristics as compared with silicon devices, because boron-doped diamond films in the prior art have only a poor crystallinity as compared with the traditional semiconducting materials such as Si or GaAs.

It is known that the crystallinity of undoped diamond films are improved if $O_2$ gas is added to the reaction gas in the CVD processes to grow diamond films [Y. Hirose and T. Terasawa; Jpn. J. Appl. Phys. Vol. 25, p. 519 (1986), and T. Kawata and K. Kondo; Jpn. J. Appl. Phys. Vol. 26, p. 1429 (1987)]. However, addition of $O_2$ in the reaction gas has not been used in the formation of p-type semiconducting diamond films, because the concentration of B in the diamond films is significantly reduced by the addition of $O_2$ due to reactions between $B_2H_6$ and $O_2$. As a result, the diamond films thus synthesized fail to exhibit desired electric characteristics.

SUMMARY OF THE INVENTION

It is therefore an object of the present invention to provide a method for forming boron-doped p-type diamond films with excellent crystallinity and desired electric characteristics.

In a preferred mode of the present invention, there is provided a method for forming boron-doped diamond films, wherein diamond films are formed on a substrate by vapor-phase synthesis using a reaction gas containing $B_2H_6$ and $O_2$ with a gas concentration ratio (volume %) of $([B_2H_6]/[O_2]) \geqq 1 \times 10^{-4}$ in addition to hydrocarbon gas and hydrogen.

BRIEF DESCRIPTION OF THE DRAWINGS

The above and other objects, features and advantages of the present invention will be more apparent from the following description taken in connection with the accompanying drawings, in which.

DETAILED DESCRIPTION OF THE PREFERRED EMBODIMENTS

Various experiments have been done by the present inventors to obtain p-type semiconducting diamond films for electronic devices. As a result, the present inventors have found that p-type semiconducting diamond films with excellent crystallinity and electric characteristics can be obtained by a method wherein diamond films are formed by CVD process using a reaction gas which contains $B_2H_6$ and $O_2$ with the gas concentration ratio ($[B_2B_6]/[O_2]$ in volume %) being within a specified range. The present invention has been produced on the basis of such experimental results.

According to the present invention, in the formation of diamond films by CVD process using a reaction gas which contains $B_2B_6$ and $O_2$ with the gas concentration ratio $[B_2H_6]/[O_2]$ (in volume %) $\geqq 1 \times 10^{-4}$. This condition is necessary to compensate the reduction in boron concentration in the diamond films due to reactions with oxygen, and hence to form p-type semiconducting diamond films with excellent crystallinity and desired electric characteristics.

In the preferable mode of the invention, for the stabilization of the electric characteristics of the boron-doped semiconducting diamond films, a heat treatment (annealing) is required after the formation of diamond films. It was found by the present inventors that by annealing the diamond films formed using a reaction gas containing $B_2H_6$ and $O_2$ with the gas concentration ratio $[B_2H_6]/[O_2]$ (in volume %) $< 1 \times 10^{-4}$, the electrical resistance of the diamond films increased to approximately the resistance of insulating diamond. Therefore, it was concluded that the gas concentration ratio $[B_2H_6]/[O_2]$ (in volume %) is required to be $1 \times 10^{-4}$ or more.

The present invention will be more clearly understood with reference to the following examples:

First, the crystallinity of a diamond film formed according to the present invention was studied. The diamond film was formed by CVD process using a reaction gas consisting of 0.5% methane in hydrogen added with 0.1 volume % $O_2$ and 0.1 ppm $B_2H_6$ ($[B_2H_6]/[O_2] = 1 \times 10^{-4}$) (Working example 1). For comparison, a diamond film was formed by CVD process using a reaction gas consisting of 0.5% methane in hydrogen added with 0.1 ppm $B_2H_6$ ($O_2$: not added) (Comparative example 1).

Figure 1:
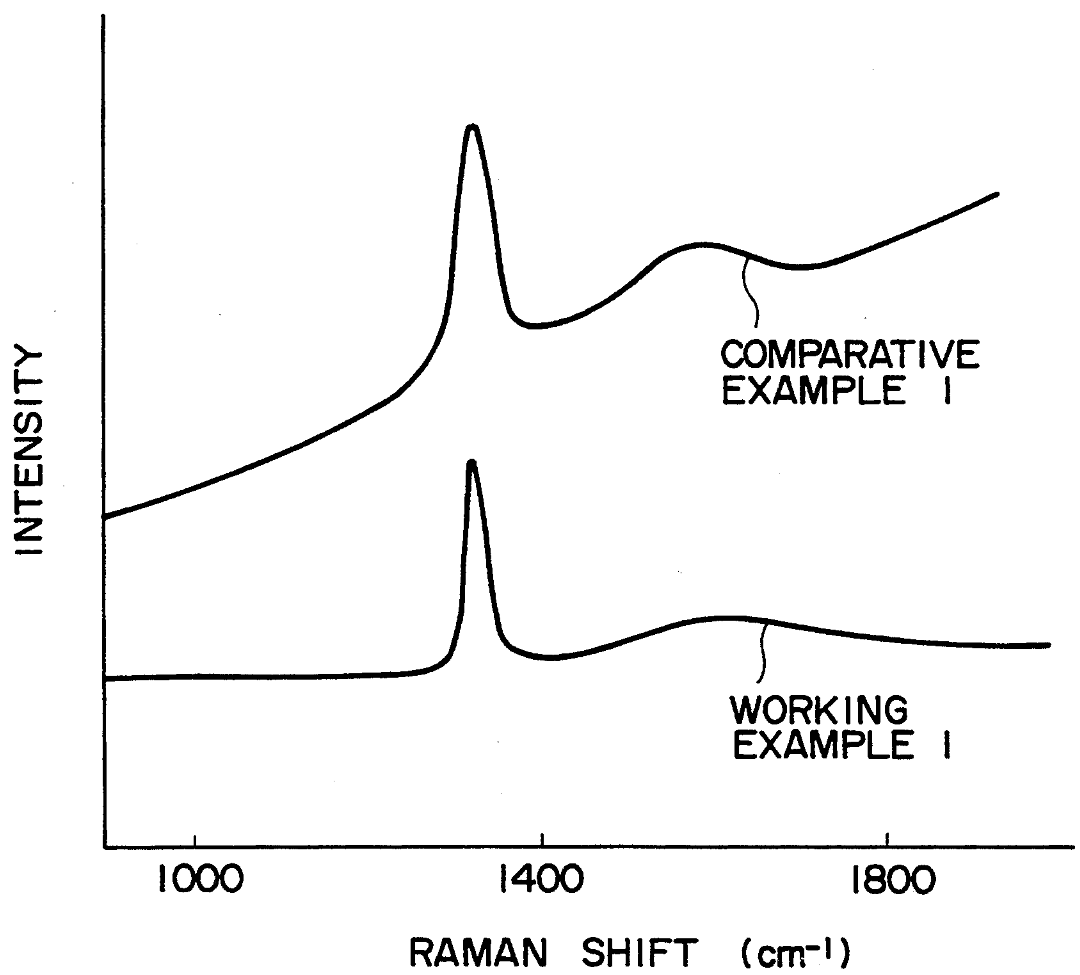
FIG. 1 is a graph showing Raman spectra of diamond films formed according to the present invention and a comparative example.

FIG. 1 shows the Raman spectra of the diamond films of Working example 1 and Comparative example 1. In this figure, the abscissa indicates the Raman shift and the ordinate indicates the Raman intensity in arbitrary units. As is apparent from FIG. 1, the peak at 1332

$cm^{-1}$ due to diamond appears in the diamond films of both Working example 1 and Comparative example 1. In the diamond film of Working example 1, there is only a very weak and broad band at 1550 $cm^{-1}$, showing a presence of non-diamond component in the film. By contrast, a stronger band exists at 1550 $cm^{-1}$ for Comparative example 1. This result indicates that the diamond film of Working example 1 contains much less non-diamond component, and hence has a better crystallinity. Also, it is seen that the diamond film of Working example 1 has a lower luminescence background, which also indicates a better crystallinity.

Next, the concentration of boron in the diamond film formed according to the present invention was examined. A diamond film was formed under the condition that the gas concentration ratio ($[B_2H_6]/[O_2]$)$=1\times10^{-4}$ 2). but the concentration of $O_2$ was changed (Working example For comparison, a diamond film was formed using a reaction gas in which the concentration of $B_2H_6$ was 0.01 ppm and the concentration of $O_2$ was changed between 0 and 0.1 volume % ($[B_2H_6]/[O_2]\leqq1\times10^{-4}$), which is Comparative example 2. It should be noted that the above diamond films were formed on Si substrates (n-type Si with a resistance of 100 Ω-cm or higher) by a microwave plasma CVD process in which, in addition to $B_2H_6$ and $O_2$ described above, the major reaction gas was 0.5% methane in hydrogen, the substrate temperature was 800° C., and the gas pressure was 35 Torr.

Figure 2:
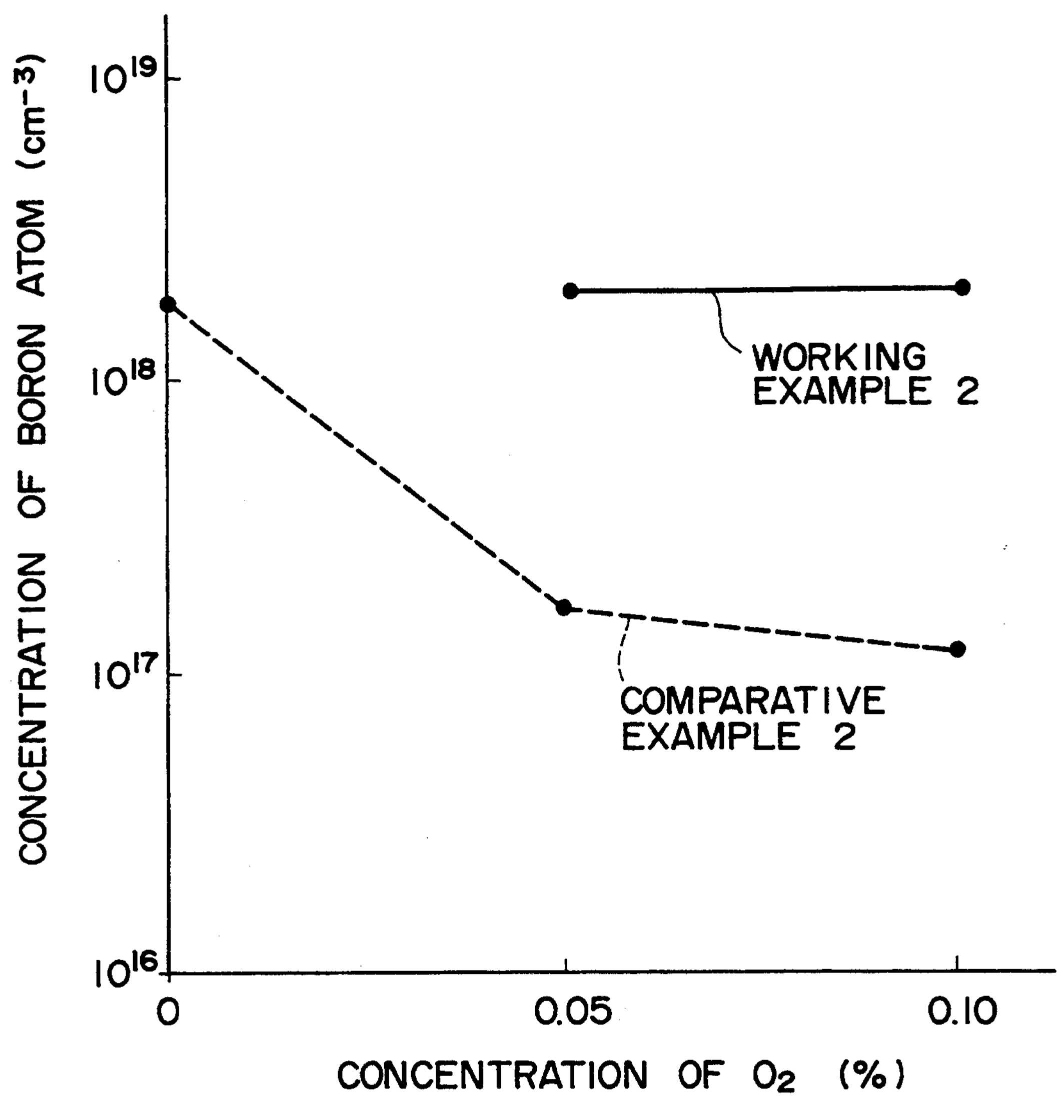
FIG. 2 is a graph showing the observed results on the concentration of boron atoms in diamond films formed according to the present invention and a comparative example.

FIG. 2 is a graph showing the boron concentrations in the diamond films measured by secondary ion mass spectrometry. In this figure, the abscissa indicates the concentration of $O_2$ and the ordinate indicates the concentration of boron. In Comparative example 2, the concentration of the boron in the diamond film decreased with an increase in the concentration of $O_2$. In contrast, in Working example 2, the concentration of the boron atoms in the diamond film is approximately constant despite the change in the concentration of $O_2$.

Next, the change in the electrical resistance of a diamond film formed according to the present invention was examined as a function of temperature.

First, a diamond film was formed by CVD process using a reaction gas added with 0.1 volume % $O_2$ and 1.0 ppm $B_2H_6$ ($[B_2H_6]/[O_2]=1\times10^{-3}$) (Working example 3). Also, a diamond film was formed by CVD process using a reaction gas added with 0.1 volume % $O_2$ and 0.1 ppm $B_2H_6$ ($[B_2H_6]/[O_2]=1\times10^{-4}$) (Working example 4). For comparison, a diamond film was formed by CVD process using a reaction gas added with 0.1 volume % $O_2$ and 0.095 ppm $B_2H_6$ ($[B_2H_6]/[O_2]=9.5\times10^{-5}$) (Comparative example 3). Other conditions of methane/hydrogen concentration, substrate material and temperature, and gas pressure were the same as before. The change in the electric resistance as a function of temperature for the diamond films of Working examples 3 and 4 and Comparative example 3 were examined both in a temperature rise process and a temperature drop process.

Figure 3:
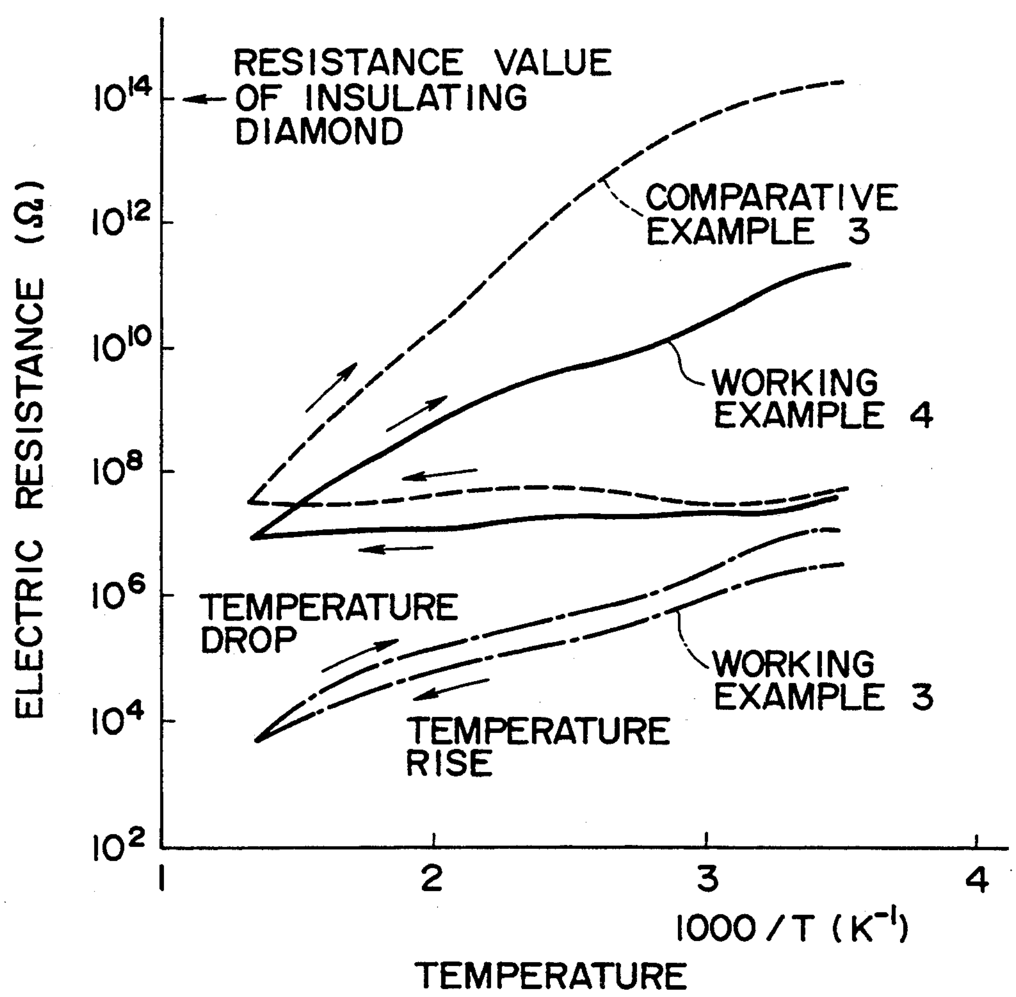
FIG. 3 is a graph showing changes in electric resistances as a function of temperature in diamond films formed according to the present invention and comparative examples.

FIG. 3 is a graph showing the changes in the electric resistances as a function of temperature in the diamond films of Working examples 3 and 4 and Comparative example 3. In this figure, the abscissa and the ordinate indicate the temperature and the electric resistance, respectively. In Comparative example 3, the resistance rapidly increased by the annealing to be almost equal to that of the insulating diamond (about $1\times10^{14}$ Ω), thereby it is impossible to use the diamond film as a p-type semiconducting material. By contrast in Working examples 3 and 4, the resistances increased only in significantly and thus these films have stable electric characteristics.

From all results described above, it was thus concluded that the boron-doped diamond films formed according to the present invention have an excellent crystallinity and electric characteristics as a p-type semiconducting material for device application.

In the following, Schottky diodes are fabricated using the semiconducting diamond film formed according to the present invention and their characteristics are examined.

Figure 4:
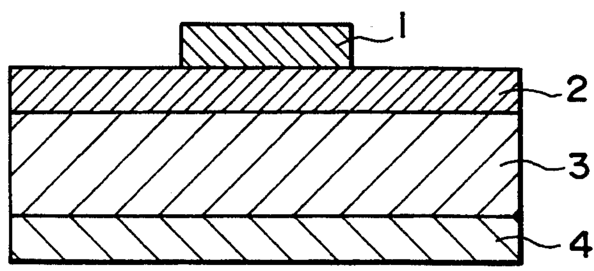
FIG. 4 is a cross sectional view of a Schottky diode fabricated using diamond films formed according to both the present invention and comparative examples.

FIG. 4 is a cross sectional view showing a typical Schottky diode fabricated using a boron-doped semiconducting film. The fabrication method is as follows:

First, a 1 μm thick p-type diamond film 2 was formed on a low resistivity Si substrate 3 using a microwave plasma CVD process in which the reaction gas used consisted of 0.5% methane in hydrogen, 0.1 ppm $B_2H_6$, and 0.1 volume % $O_2$ ($[B_2H_6]/[O_2]=10^{-4}$). The substrate temperature was 800° C. and the gas pressure was 35 Torr during the CVD process.

Next, the diamond film was heat-treated in vacuum at 850° C. for 30 min to stabilize the electric characteristics of the film. Subsequently, an Al electrode 1 with a diameter of 100 μm and a thickness of 2000 Å was selectively formed on the p-type diamond film 2 by electron beam deposition. Finally, a silver paste 4 is coated on the back surface side of the Si substrate 3 to form an ohmic contact (Working example 6).

For comparison, a Schottky diode was formed under the same processes as in Working example 6, except that the reaction gas contained 0.5% methane in hydrogen and 0.1 ppm $B_2H_6$ ($O_2$: not added) for diamond growth (Comparative example 5).

Figure 5:
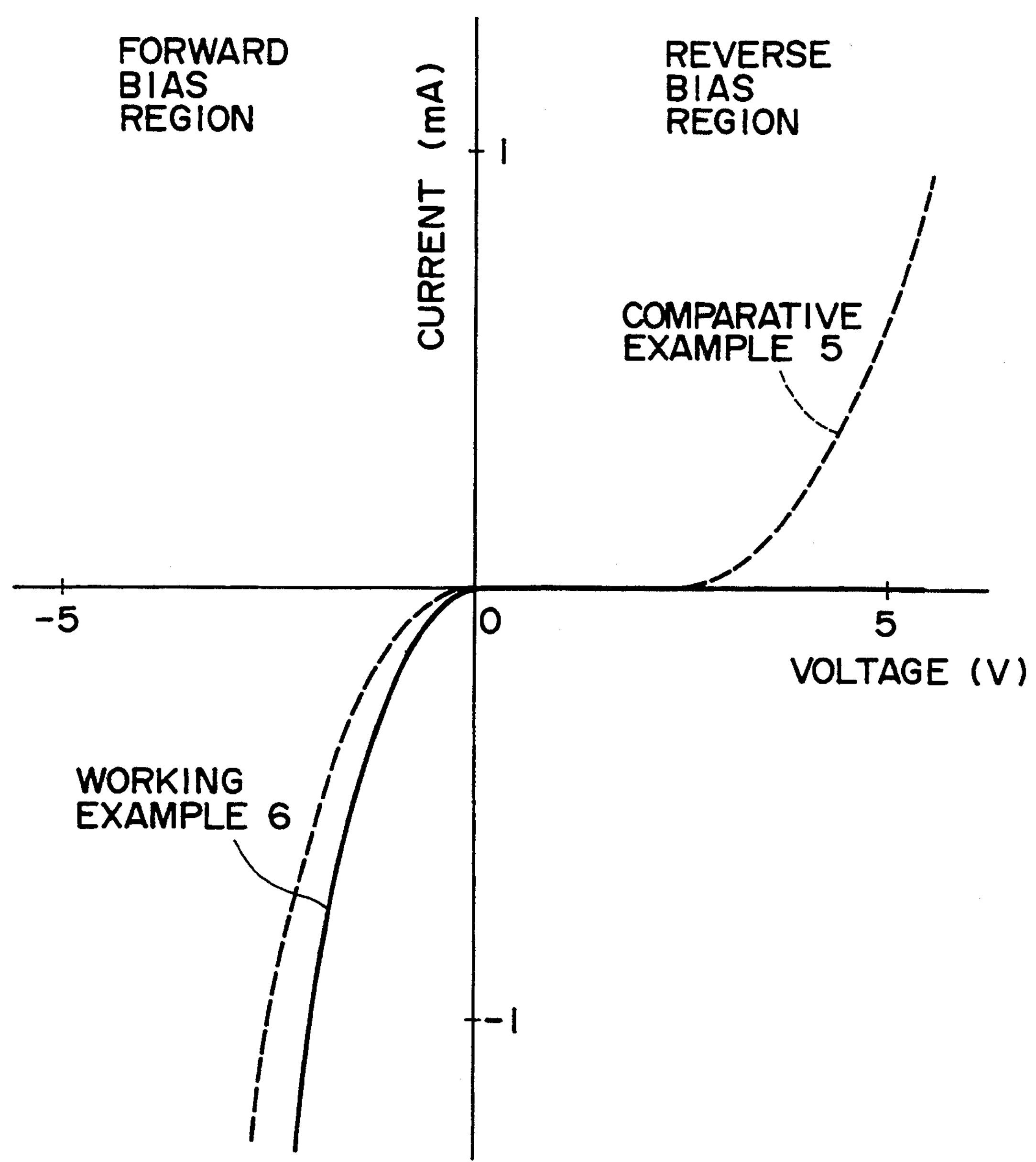
FIG. 5 is a graph showing current-voltage characteristics of Schottky diodes made according to the present invention and a comparative example.

FIG. 5 shows the measured current-voltage characteristics of fabricated diodes. In the diode of Comparative example 5, the current leakage occurred at about 3 V in the reversed bias region. By contrast, in the diode of Working example 6, the current leakage was significantly small, exhibiting a preferable rectifying characteristic.

Further, a Schottky diode was formed under the same process as in Working example 6, except that the reaction gas contained 0.05 ppm $B_2H_6$ and 0.1 volume % $O_2$ (Comparative example 6).

Figure 6:
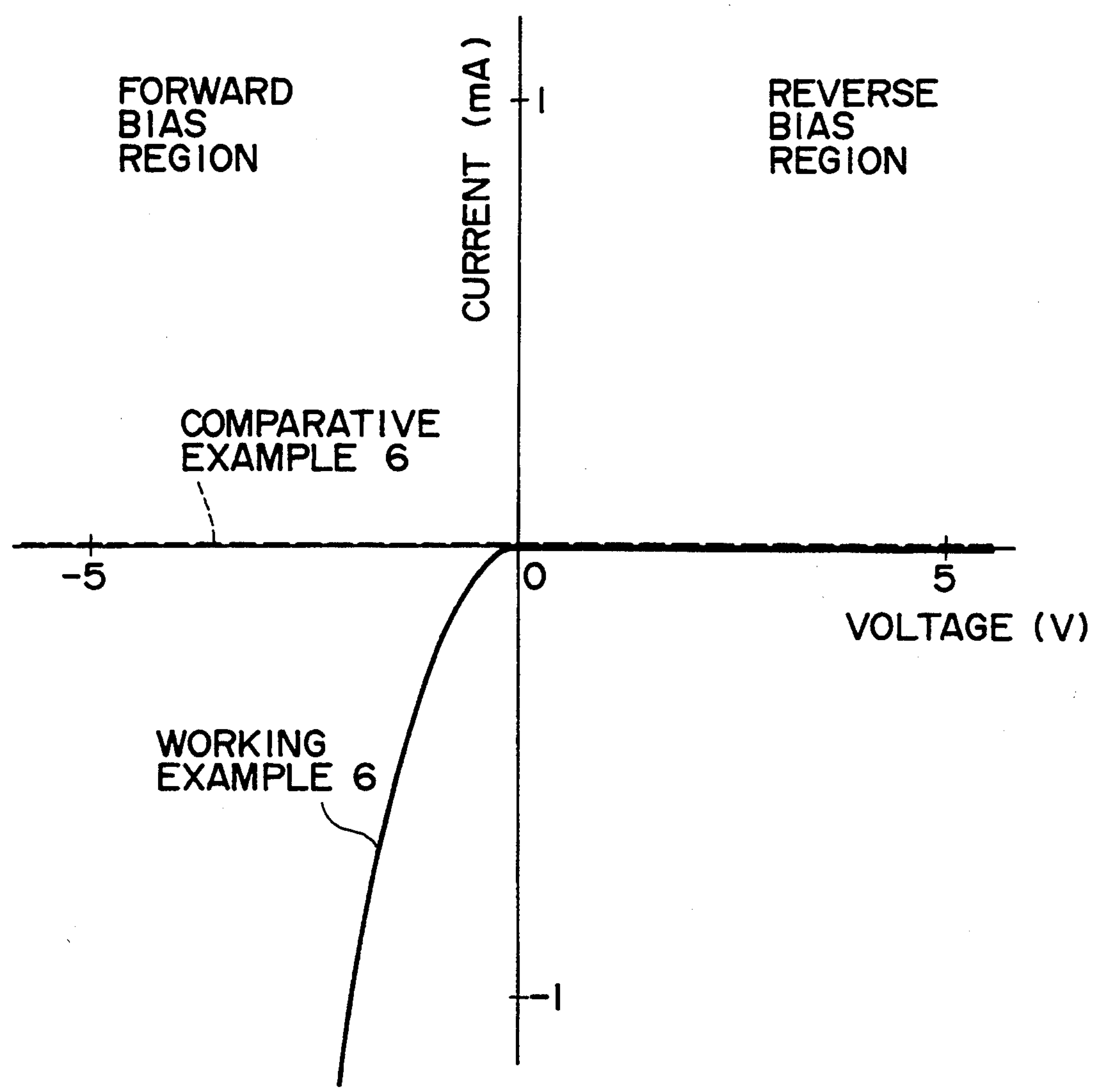
FIG. 6 is a graph showing current-voltage characteristics of Schottky diodes made according to the present invention and a comparative example.

FIG. 6 is a graph showing the measured current-voltage characteristics for the Schottky diodes of Working example 6 and Comparative example 6. The Schottky diode of Working example 6 exhibited a preferable rectifying characteristic, while the Schottky diode of Comparative example 6 has a very high resistance and the current was extremely small.

From the above experiments, it was concluded that if diamond films are formed according to the present invention by the CVD process using a reaction gas containing $B_2H_6$ and $O_2$ with a gas concentration ratio ($[B_2H_6]/[O_2]$)$\geqq1\times10^{-4}$ in addition to a hydrocarbon gas in hydrogen, it is possible to form p-type semiconducting diamond films with an excellent crystallinity and stable electric characteristics, which can be used for electronic devices.

What is claimed is

1. A method for forming a p-type semiconducting diamond film on a substrate by vapor-phase synthesis using a reaction gas which contains $B_2H_6$ and $O_2$ with a gas concentration ratio (volume %) of $([B_2H_6]/[O_2]) \geqq 1 \times 10^{-4}$ in addition to at least a hydrocarbon gas in hydrogen.

2. A method for forming a p-type semiconducting diamond film, comprising the steps of:

providing a substrate in a vapor-phase synthesis chamber;

exposing a surface of the substrate to a reaction gas comprising $B_2H_6$ and $O_2$, wherein a gas concentration ratio by volume percent of $B_2H_6$ to $O_2$ in the reaction gas is greater than $10^{-4}$, wherein said reaction gas also comprises a hydrocarbon gas and hydrogen.

* * * * *